US009859321B2

United States Patent
Kim et al.

(10) Patent No.: US 9,859,321 B2
(45) Date of Patent: Jan. 2, 2018

(54) STACK-TYPE SEMICONDUCTOR DEVICE

(71) Applicant: SAMSUNG ELECTRONICS CO., LTD., Suwon-si, Gyeonggi-Do (KR)

(72) Inventors: Donghyun Kim, Suwon-Si (KR); Doowon Kwon, Seongnam-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/333,382

(22) Filed: Oct. 25, 2016

(65) Prior Publication Data
US 2017/0125471 A1    May 4, 2017

(30) Foreign Application Priority Data
Oct. 29, 2015 (KR) .................. 10-2015-0151026

(51) Int. Cl.
*H01L 31/062* (2012.01)
*H01L 31/113* (2006.01)
*H01L 27/146* (2006.01)

(52) U.S. Cl.
CPC .... *H01L 27/14634* (2013.01); *H01L 27/1464* (2013.01); *H01L 27/1469* (2013.01); *H01L 27/14621* (2013.01); *H01L 27/14627* (2013.01); *H01L 27/14645* (2013.01)

(58) Field of Classification Search
CPC ......... H01L 27/14634; H01L 27/14621; H01L 27/14627; H01L 27/1464; H01L 27/1469; H01L 23/522; H01L 23/5221; H01L 23/5226; H01L 23/5381; H01L 23/5383; H01L 23/5384; H01L 23/5386; H01L 21/76897; H01L 2225/06541
See application file for complete search history.

(56) References Cited

U.S. PATENT DOCUMENTS

| | | | |
|---|---|---|---|
| 8,395,478 B2 | 3/2013 | Diab et al. | |
| 8,766,772 B2 | 7/2014 | Martinez de Velasco Cortina et al. | |
| 8,799,999 B2 | 8/2014 | Rombouts | |
| 9,543,193 B2 * | 1/2017 | Lu | H01L 21/31144 |

(Continued)

FOREIGN PATENT DOCUMENTS

| | | |
|---|---|---|
| JP | 2006-060392 A1 | 3/2006 |
| JP | 2011-048523 A | 3/2011 |

(Continued)

*Primary Examiner* — Thanh Y Tran
(74) *Attorney, Agent, or Firm* — Volentine & Whitt, PLLC

(57) ABSTRACT

A stack-type semiconductor device includes a lower device and an upper device disposed on the lower device. The lower device includes a lower substrate, a lower interconnection on the lower substrate, a lower pad on the lower interconnection, and a lower interlayer insulating layer covering side surfaces of the lower interconnection and the lower pad. The upper device includes an upper substrate, an upper interconnection under the upper substrate, an upper pad under the upper interconnection, and an upper interlayer insulating layer covering side surfaces of the upper interconnection and the upper pad. Each of the pads has a thick portion and a thin portion. The thin portions of the pads are bonded to each other, the thick portion of the lower pad contacts the bottom of the upper interlayer insulating layer, and the thick portion of the upper pad contacts the top of the lower interlayer insulating layer.

20 Claims, 15 Drawing Sheets

(56) References Cited

U.S. PATENT DOCUMENTS

| | | |
|---|---|---|
| 2007/0131759 A1 | 6/2007 | Cox et al. |
| 2007/0181672 A1 | 8/2007 | Sawamura |
| 2008/0197501 A1* | 8/2008 | Imanaka ............. H01L 21/4857 257/758 |
| 2010/0308464 A1* | 12/2010 | Tsutsue ................. H01L 23/564 257/758 |
| 2012/0105200 A1 | 5/2012 | Yoo et al. |
| 2013/0231046 A1 | 9/2013 | Pope et al. |
| 2014/0306341 A1* | 10/2014 | Hou ................. H01L 23/49811 257/737 |
| 2015/0121541 A1 | 4/2015 | Fay |
| 2015/0127549 A1 | 5/2015 | Khan |
| 2015/0127553 A1 | 5/2015 | Sundaram et al. |
| 2017/0047301 A1* | 2/2017 | Yang ....................... H01L 24/05 |

FOREIGN PATENT DOCUMENTS

| | | |
|---|---|---|
| KR | 1020090071947 A | 7/2009 |
| KR | 1020100029918 A | 3/2010 |

* cited by examiner

STACK-TYPE SEMICONDUCTOR DEVICE

PRIORITY STATEMENT

This application claims priority under 35 U.S.C. §119 to Korean Patent Application No. 10-2015-0151026 filed on Oct. 29, 2015, the disclosure of which is hereby incorporated by reference in its entirety.

BACKGROUND

The inventive concept relates to a semiconductor device and to a method of fabricating the same. More particularly, the inventive concept relates to a stack-type semiconductor device in which similar structures are stacked on each other and to a method of fabricating the same.

Highly integrated semiconductor devices have been realized by processing silicon wafers, and stacking and bonding the silicon wafers. When bonding the silicon wafers, internal interconnections of each of the silicon wafers are electrically connected to each other using metal pads. At this time, a bonding failure can occur between insulating layers, at regions thereof beside the metal pads, due to thermal expansion of the metal pads caused by heat used for the process of bonding the silicon wafers.

SUMMARY

In accordance with an aspect of the inventive concept, there is provided a stack-type semiconductor device including a lower device including a lower substrate, a lower interconnection structure on the lower substrate, a lower pad on the lower interconnection structure, and lower interlayer insulation covering side surfaces of the lower interconnection structure and of the lower pad, and an upper device disposed on the lower device and including an upper substrate, an upper interconnection structure under the upper substrate, an upper pad under the upper interconnection structure, and upper interlayer insulation covering side surfaces of the upper interconnection structure and of the upper pad, and in which the lower pad has a first portion and a second portion, the first portion of the lower pad being thicker, in a vertical direction, than the second portion of the lower pad, the upper pad has a first portion and a second portion, the first portion of the upper pad being thicker, in a vertical direction, than the second portion of the upper pad, and the second portion of the lower pad is bonded to the upper pad at the second portion of the upper pad, the first portion of the lower pad is in contact with a lower surface of the upper interlayer insulation, and the first portion of the upper pad is in contact with an upper surface of the lower interlayer insulation.

In accordance with another aspect of the inventive concept, there is provided a stack-type semiconductor device including a lower substrate, a lower interconnection structure disposed on the lower substrate, a lower pad disposed on the lower interconnection structure, an upper pad disposed on the lower pad, an upper interconnection structure disposed on the upper pad, and an upper substrate disposed on the upper interconnection structure, and in which the lower pad has a first portion that is in contact with the lower interconnection structure, and a second portion that extends horizontally from an upper portion of one side of the first portion of the lower pad, the second portion of the lower pad being thinner than the first portion of the lower pad in a vertical direction, in which the upper pad has a first portion, and a second portion that extends horizontally from a lower portion of one side of the first portion of the upper pad and is bonded to the second portion of the lower pad, the second portion of the upper pad being thinner than the first portion of the upper pad in the vertical direction, in which the upper interconnection is in contact with the first portion of the upper pad, and in which the first portion of the lower pad and the first portion of the upper pad are disposed along a diagonal direction inclined relative to the vertical.

In accordance with another aspect of the inventive concept, there is provided a stack-type semiconductor device including a lower semiconductor substrate, lower interlayer insulation disposed on the lower substrate and having an upper surface, upper interlayer insulation disposed on the lower interlayer insulation and having a lower surface constituting an interface with the upper surface of the said lower interlayer insulation, an upper semiconductor substrate disposed on the upper interlayer insulation and an interlayer contact structure embedded in the interlayer insulation and comprising a lower land of conductive material disposed in an upper portion of the lower interlayer insulation, a lower via integral with the lower land at an outer peripheral portion of the lower land and extending vertically within the lower interlayer insulation, an upper land of conductive material disposed in a lower portion of the upper interlayer insulation, and an upper via integral with the upper land at an outer peripheral portion of the upper land and extending vertically within the upper interlayer insulation, and in which at least parts of the upper and lower lands are disposed directly across from one another on opposite sides of said plane coincident with the interface between the lower interlayer insulation and upper interlayer insulation, the upper and lower vias are laterally offset entirely from each other, the lower via extends further into the lower interlayer insulation than the lower land relative to said plane coincident with the interface between the lower interlayer insulation and upper interlayer insulation, and the upper via extends further into the upper interlayer insulation than the upper via relative to said plane coincident with the interface between the lower interlayer insulation and upper interlayer insulation.

BRIEF DESCRIPTION OF THE DRAWINGS

The foregoing and other features and advantages of the inventive concept will be apparent from the detailed description of examples of the inventive concept, as illustrated in the accompanying drawings in which like reference numerals denote the same respective parts throughout the different views. The drawings are not necessarily to scale, emphasis instead being placed upon illustrating the principles of the inventive concept. In the drawings.

DETAILED DESCRIPTION

Figure 1A:
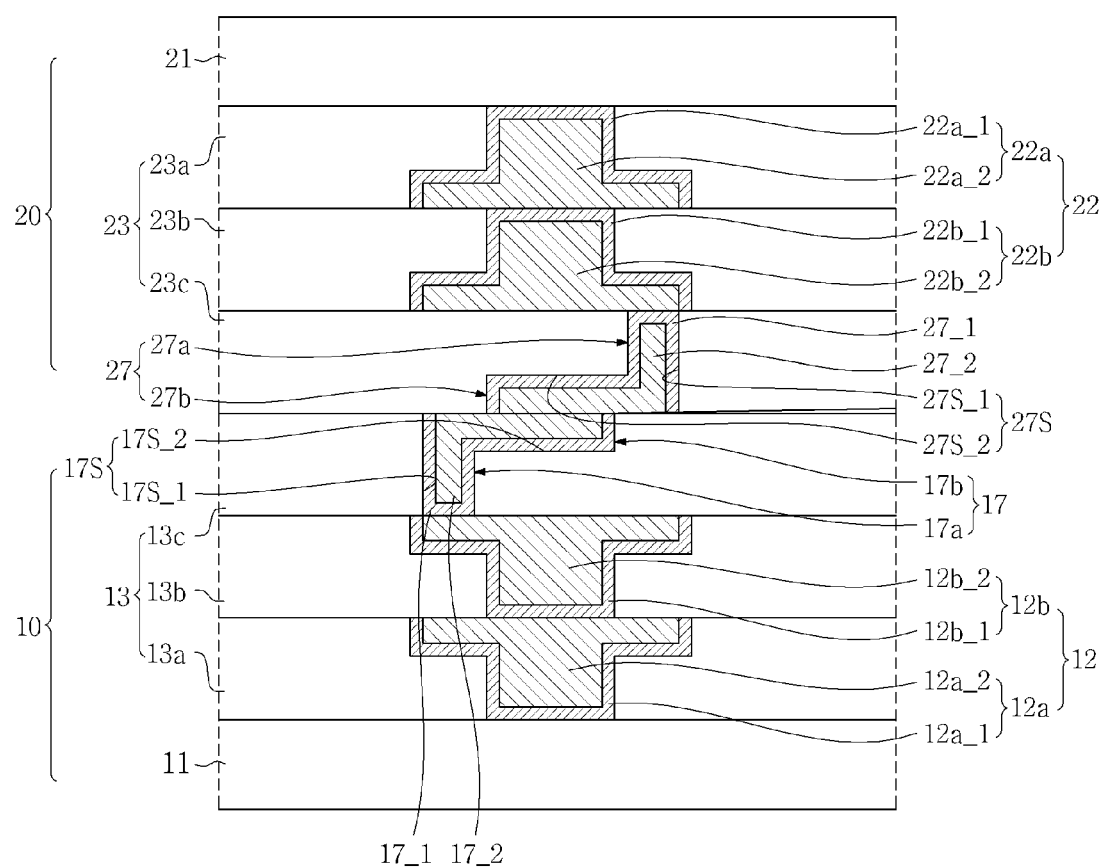
FIGS. 1a and 1b are longitudinal cross-sectional views illustrating stack-type semiconductor devices according to various examples of the inventive concept.

Examples of the inventive concept will now be described more fully with reference to the accompanying drawings to clarify aspects, features, and advantages of the inventive concept. The inventive concept may, however, be exemplified in many different forms and should not be construed as being limited to the examples set forth herein. Rather, these examples are provided so that this disclosure will be through and complete, and will fully convey the inventive concept to those of ordinary skill in the art. The inventive concept is defined by the appended claims.

The terminology used herein to describe examples of the inventive concept is not intended to limit the scope of the inventive concept. The articles "a," "an," and "the" are singular in that they have a single referent; however, the use of the singular form in the present document should not preclude the presence of more than one referent. In other words, elements of the inventive concept referred to in the singular form may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected to, or coupled to the other element or layer or intervening elements or layers may be present. In contrast, when an element is referred to as being "directly on," "directly connected to," or "directly coupled to" another element or layer, there are no intervening elements or layers present. In the following description, the same reference numerals denote the same components throughout the specification.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation. The same is true for the terms of dimensions, such as "thickness" or "width", i.e., these terms apply to the orientations shown in the drawings such that thickness will refer to a vertical dimension in the orientation shown in the drawings and "width" will refer to a horizontal dimension. In addition, when comparing "widths" it will be understood that the widths being referred to are in the same direction unless otherwise noted. The term "diagonal" may refer to any direction that is oblique with respect to sides of elements having a generally rectangular form and may describe a direction that extends through geometric centers of the elements or their shapes as viewed in plan, as the context will make clear. The term "side surfaces" may be used to refer to the outer periphery or outer peripheral edge of a particular element.

Examples are described herein with reference to cross-sectional and/or planar illustrations that are schematic illustrations of idealized examples and intermediate structures. In the drawings, the sizes and relative sizes of layers and regions may be exaggerated for clarity. Therefore, variations from the shapes of the illustrations as a result, for example, of manufacturing techniques and/or tolerances, are to be expected. Thus, the inventive concept should not be construed as limited to the particular shapes of regions in the examples illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Other terminology used herein for the purpose of describing particular examples of the inventive concept is to be taken in context and given its plain meaning as would be understood by those skilled in the art. For example, the term "via" will be understood in its broadest sense to refer to a substantially vertical electrical conductor and may be a through-via with respect to a given layer or a blind via in the overall device.

FIG. 1a is a longitudinal cross-sectional view of an example of a stack-type semiconductor device according to the inventive concept.

Referring to FIG. 1a, the example of the stack-type semiconductor device 100A according to the inventive concept may include a lower device 10 and an upper device 20 stacked on and bonded to the lower device 10.

The lower device 10 may include a lower substrate 11, lower interconnection structure 12 on the lower substrate 11 (which may be referred to hereinafter as "lower interconnection 12"), a lower pad 17 on the lower interconnection 12, and a lower interlayer insulating layer 13 (which may be referred to as simply "lower interlayer insulation 13") surrounding side surfaces of the lower interconnection 12 and the lower pad 17.

The lower substrate 11 may be constituted by a bulk single crystalline silicon wafer, a silicon-on-insulator (SOI) wafer, a compound semiconductor wafer (wafer of a semiconductor compound) such as a silicon germanium (SiGe), a wafer on which a silicon epitaxial layer has been grown, etc.

The lower interconnection 12 may include a first lower interconnection 12a on the lower substrate 11 and a second lower interconnection 12b on the first lower interconnection 12a. FIG. 1a shows an example in which the lower interconnection 12 has two layers, but the present inventive concept is not limited thereto, and the lower interconnection 12 may have a single layer (one layer only) or three or more layers.

The first lower interconnection 12a and the second lower interconnection 12b may each comprise a mixed type of interconnection made up of a via interconnection (or simply "via") and a planar interconnection (which may be referred to as a "land") overlapping the via interconnection and having a width (dimension in a horizontal direction) greater than that of the via interconnection. A lower surface of the first lower interconnection 12a may be in contact with the lower substrate 11, and a part of an upper surface of the second lower interconnection 12b may be in contact with the lower pad 17.

The first lower interconnection 12a may include a first lower interconnection barrier pattern 12a_1 and a first lower interconnection metal pattern 12a_2 on the first lower interconnection barrier pattern 12a_1. Lower and side surfaces of the first lower interconnection metal pattern 12a_2 may be covered by the first lower interconnection barrier pattern 12a_1. The second lower interconnection 12b may include a second lower interconnection barrier pattern 12b_1 and a second lower interconnection metal pattern 12b_2 on the second lower interconnection barrier pattern 12b_1. Lower and side surfaces of the second lower interconnection metal pattern 12b_2 may be covered by the second lower interconnection barrier pattern 12b_1.

The first lower interconnection barrier pattern 12a_1 and the second lower interconnection barrier pattern 12b_1 may include titanium (Ti), titanium nitride (TiN), tantalum (Ta), tantalum nitride (TaN), titanium tungsten (TiW), or various other barrier metals. The first lower interconnection metal pattern 12a_2 and the second lower interconnection metal pattern 12b_2 may include a metal such as copper (Cu), tungsten (W), aluminum (Al), cobalt (Co), or nickel (Ni).

The lower pad 17 may occupy a lower pad space 17S, and may include a lower pad barrier pattern 17_1 and a lower pad metal pattern 17_2 formed in the lower pad space 17S. The lower pad 17 may have a first portion 17a having a relatively great thickness or height (dimension in the vertical direction) and a second portion 17b having a relatively small thickness or height.

The lower pad space 17S may include a first lower pad space 17S_1 passing through part of the lower interlayer insulating layer 13 and exposing a part of an upper surface of the second lower interconnection 12b, and a second lower pad space 17S_2 connected to a side of the first lower pad space 17S_1 and having a depth less than a depth of the first lower pad space 17S_1. A width of the second lower pad space 17S_2 may be greater than a width of the first lower pad space 17S_1.

The first portion 17a of the lower pad 17 may fill the first lower pad space 17S_1, and the second portion 17b of the lower pad 17 may fill the second lower pad space 17S_2.

The second portion 17b of the lower pad 17 may have a first side that vertically overlaps an upper pad 27 of the upper device 20, and a second side that does not vertically overlap the upper pad 27 of the upper device 20. The first portion 17a of the lower pad 17 may be connected to the second side of the second portion 17b of the lower pad 17. The first portion 17a of the lower pad 17 may be unitary, i.e., contiguous, with the second portion 17b of the lower pad 17.

The lower pad barrier pattern 17_1 may be conformally formed on a bottom surface and inner sidewall surfaces delimiting the lower pad space 17S. The lower pad barrier pattern 17_1 may include titanium (Ti), titanium nitride (TiN), tantalum (Ta), tantalum nitride (TaN), titanium tungsten (TiW), or any other suitable barrier metal.

The lower pad metal pattern 17_2 may be formed on the lower pad barrier pattern 17_1 to fill the lower pad space 17S. The lower pad metal pattern 17_2 may include a metal such as copper (Cu), tungsten (W), aluminum (Al), cobalt (Co), or nickel (Ni).

The lower interlayer insulating layer 13 may include a first lower interlayer insulating layer 13a that is disposed on the lower substrate 11 and covers side surfaces of the first lower interconnection 12a, a second lower interlayer insulating layer 13b that is disposed on the first lower interlayer insulating layer 13a and covers side surfaces of the second lower interconnection 12b, and a third lower interlayer insulating layer 13c that is disposed on the second lower interlayer insulating layer 13b and covers side surfaces of the lower pad 17.

An upper surface of the first lower interlayer insulating layer 13a may be substantially coplanar with an upper surface of the first lower interconnection 12a. An upper surface of the second lower interlayer insulating layer 13b may be substantially coplanar with an upper surface of the second lower interconnection 12b. An upper surface of the third lower interlayer insulating layer 13c may be substantially coplanar with an upper surface of the lower pad 17. The first lower interlayer insulating layer 13a, the second lower interlayer insulating layer 13b, and the third lower interlayer insulating layer 13c may include silicon oxide ($SiO_2$).

The upper device 20 may include an upper substrate 21, an upper interconnection structure 22 under the upper substrate 21 (which may be referred to hereinafter as "upper interconnection 22"), an upper pad 27 under the upper interconnection 22, and an upper interlayer insulating layer 23 (which may be referred to simply as "upper interlayer insulation 23").

The upper substrate 21 may be a bulk single crystalline silicon wafer, an SOI wafer, a compound semiconductor wafer such as a silicon germanium (SiGe), a wafer on which a silicon epitaxial layer is grown, etc.

The upper interconnection 22 may include a first upper interconnection 22a under the upper substrate 21, and a second upper interconnection 22b under the first upper interconnection 22a. In some examples, the upper interconnection 22 may have a single layer (i.e., one layer only) or may have three or more layers.

The first upper interconnection 22a and the second upper interconnection 22b may each be a mixed type of interconnection constituted by a via interconnection and a planar interconnection overlapping the via interconnection and having a width greater than a width of the via interconnection. An upper surface of the first upper interconnection 22a may be in contact with the upper substrate 21, and a part of a lower surface of the second upper interconnection 22b may be in contact with the upper pad 27.

The first upper interconnection 22a may include a first upper interconnection barrier pattern 22a_1 and a first upper interconnection metal pattern 22a_2 on the first upper interconnection barrier pattern 22a_1. The second upper interconnection 22b may include a second upper interconnection barrier pattern 22b_1 and a second upper interconnection metal pattern 22b_2 on the second upper interconnection barrier pattern 22b_1. Lower and side surfaces of the first upper interconnection metal pattern 22a_2 may be covered by the first upper interconnection barrier pattern 22a_1. Lower and side surfaces of the second upper interconnection metal pattern 22b_2 may be covered by the second upper interconnection barrier pattern 22b_1.

The first upper interconnection barrier pattern 22a_1 and the second upper interconnection barrier pattern 22b_1 may include titanium (Ti), titanium nitride (TiN), tantalum (Ta), tantalum nitride (TaN), titanium tungsten (TiW), or any other suitable barrier metal. The first upper interconnection metal pattern 22a_2 and the second upper interconnection metal pattern 22b_2 may include a metal such as copper (Cu), tungsten (W), aluminum (Al), cobalt (Co), or nickel (Ni).

The upper pad 27 may occupy an upper pad space 27S, and may include an upper pad barrier pattern 27_1 and an upper pad metal pattern 27_2 formed in the upper pad space 27S. The upper pad 27 may include a first portion 27a having a relatively great thickness and a second portion 27b having a relatively small thickness.

The upper pad space 27S may include a first upper pad space 27S_1 partially passing through the upper interlayer insulating layer 23 and exposing a part of a lower surface of the second upper interconnection 22b, and a second upper pad space 27S_2 connected to one side of the first upper pad space 27S_1 and having a depth less than a depth of the first upper pad space 27S_1. A width of the second upper pad space 27S_2 may be greater than a width of the first upper pad space 27S_1.

The first portion 27a of the upper pad 27 may fill the first upper pad space 27S_1, and the second portion 27b of the upper pad 27 may fill the second upper pad space 27S_2.

The second portion 27b of the upper pad 27 may have a first side that vertically overlaps a lower pad 17 of the lower device 10, and a second side that does not vertically overlap the lower pad 17 of the lower device 10. The first portion 27a of the upper pad 27 may be connected to the second side of the second portion 27b of the upper pad 27. The first portion 27a of the upper pad 27 may be unitary, i.e., contiguous, with the second portion 27b of the upper pad 27.

The upper pad barrier pattern 27_1 may be conformally formed on a bottom surface and inner sidewall surfaces defining the upper pad space 27S. The upper pad barrier pattern 27_1 may include titanium (Ti), titanium nitride (TiN), tantalum (Ta), tantalum nitride (TaN), titanium tungsten (TiW), or any other suitable barrier metal.

The upper pad metal pattern 27_2 may be formed on the upper pad barrier pattern 27_1 to fill the upper pad space 27S. The upper pad metal pattern 27_2 may include a metal such as copper (Cu), tungsten (W), aluminum (Al), cobalt (Co), or nickel (Ni).

The upper interlayer insulating layer 23 may include a first upper interlayer insulating layer 23a that is disposed under the upper substrate 21 and covers side surfaces of the first upper interconnection 22a, a second upper interlayer insulating layer 23b that is disposed under the first upper interlayer insulating layer 23a and covers side surfaces of the second upper interconnection 22b, and a third upper interlayer insulating layer 23c that is disposed under the second upper interlayer insulating layer 23b and covers side surfaces of the upper pad 27.

A lower surface of the first upper interlayer insulating layer 23a may be substantially coplanar with a lower surface of the first upper interconnection 22a. A lower surface of the second upper interlayer insulating layer 23b may be substantially coplanar with a lower surface of the second upper interconnection 22b. A lower surface of the third upper interlayer insulating layer 23c may be substantially coplanar with a lower surface of the upper pad 27. The first upper interlayer insulating layer 23a, the second upper interlayer insulating layer 23b, and the third upper interlayer insulating layer 23c may include silicon oxide ($SiO_2$).

Thus, the lower pad 17 and the upper pad 27 may together constitute an interlayer contact structure embedded in the interlayer insulation 13, 23. The contact structure includes a lower land of conductive material (namely, the second portion 17b of the lower pad 17) disposed in an upper portion of the lower interlayer insulation 13, a lower via (first portion 17a of lower pad 17) integral with the lower land at an outer peripheral portion of the lower land and extending vertically within the lower interlayer insulation 13, an upper land of conductive material (namely, the second portion 27b of the upper pad 27) disposed in a lower portion of the upper interlayer insulation 23, and an upper via (first portion 27a of upper pad 27) integral with the upper land at an outer peripheral portion of the upper land and extending vertically within the upper interlayer insulation 23.

The lower pad 17 and the upper pad 27 may be offset from one another in a lateral direction. For example, the first side of the second portion 17b of the lower pad 17 may vertically overlap the upper pad 27, and the first side of the second portion 27b of the upper pad 27 may vertically overlap the lower pad 17. Also, the second side of the second portion 17b of the lower pad 17 and the first portion 17a of the lower pad 17 may not vertically overlap the upper pad 27, and the second side of the second portion 27b of the upper pad 27 and the first portion 27a of the upper pad 27 may not vertically overlap the lower pad 17.

Accordingly, the first portion 17a of the lower pad 17 may vertically overlap the third upper interlayer insulating layer 23c of the upper device 20, and the first portion 27a of the upper pad 27 may vertically overlap the third lower interlayer insulating layer 13c of the lower device 10. In other words, the lower surface of the first portion 17a of the lower pad 17 may be in contact with a portion of the upper surface of the second lower interconnection 12b, and the upper surface of the first portion 17a of the lower pad 17 may be in contact with a portion of the lower surface of the third upper interlayer insulating layer 23c. Also, the upper surface of the first portion 27a of the upper pad 27 may be in contact with a portion of the lower surface of the second upper interconnection 22b, and the lower surface of the first portion 27a of the upper pad 27 may be in contact with a portion of the upper surface of the third lower interlayer insulating layer 13c. The first portion 17a of the lower pad 17 may be disposed in a diagonal direction with respect to the first portion 27a of the upper pad 27.

Furthermore, most of the upper surface of the third lower interlayer insulating layer 13c of the lower device 10 may be directly bonded to most of the lower surface of the third upper interlayer insulating layer 23c of the upper device 20.

As above described, the lower pad 17 and the upper pad 27 may include a metal. Accordingly, the lower pad 17 and the upper pad 27 may be expanded by heat generated in a heating process for bonding the lower device 10 and the upper device 20. At this time, the coefficient of thermal expansion of the lower pad 17 and the upper pad 27 may vary depending on their thicknesses. For example, the coefficients of thermal expansion of portions of the lower pad 17 and the upper pad 27 of portions respectively increase in proportion to increases in the thicknesses of the lower pad 17 and the upper pad 27. Or put another way, the coefficients of thermal expansion of portions of the lower pad 17 and the upper pad 27 respectively decrease in inverse proportion to increases in thicknesses of the lower pad 17 and the upper pad 27.

A repulsive force tends to be created between the lower pad 17 and the upper pad 27 due to thermal expansion of the lower pad 17 and the upper pad 27. If the repulsive force is too great, i.e., it the coefficients of thermal expansion are too high, a gap could occur between a surface of the third lower interlayer insulating layer 13c covering the side surface of the lower pad 17 and a surface of the third upper interlayer insulating layer 23c covering the side surface of the upper pad 27. That is, a bonding failure could occur between the third lower interlayer insulating layer 13c and the third upper interlayer insulating layer 23c.

However, in the present example, the second portion 17b of the lower pad 17 and the second portion 27b of the upper pad 27 that have relatively small thicknesses are in contact with each other, and the first portion 17a of the lower pad and the first portion 27a of the upper pad 27 that have relatively great thicknesses are misaligned. As a result, the bonding failure of the third lower interlayer insulating layer 13c and the third upper interlayer insulating layer 23c may be mitigated.

Meanwhile, when performing a planarization process, such as a CMP of process, for forming the lower pad 17 and the upper pad 27, surfaces of the third lower interlayer insulating layer 13c and the third upper interlayer insulating layer 23c may be eroded around the lower pad 17 and the upper pad 27, and the first portion 17a of the lower pad 17 and the first portion 27a of the upper pad 27 may be in contact with the eroded area of the third upper interlayer insulating layer 23c and the eroded area of the third lower interlayer insulating layer 13c, respectively.

Accordingly, although the first portion 17a of the lower pad 17 and the first portion 27a of the upper pad 27 having relatively great thicknesses thermally expand more than the second portion 17b of the lower pad 17 and the second portion 27b of the upper pad 27, the first portion 17a of the lower pad 17 and the first portion 27a of the upper pad 27 may not press too hard against the third upper interlayer insulating layer 23c and the third lower interlayer insulating layer 13c. As a result, the first portion 17a of the lower pad 17 and the first portion 27a of the upper pad 27 may not affect a bonding state between the third upper interlayer insulating layer 23c and the third lower interlayer insulating layer 13c.

Figure 1B:
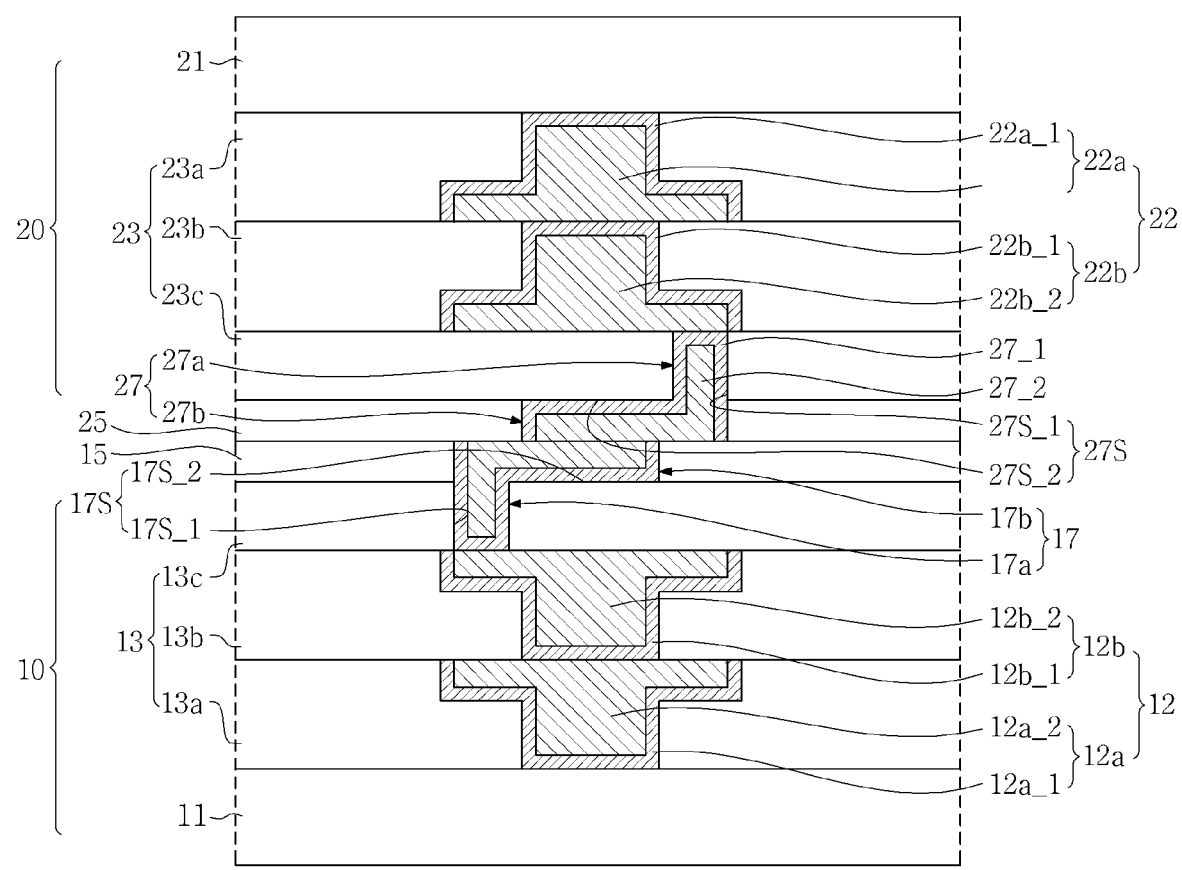

FIG. 1b is a longitudinal cross-sectional view of another example of a stack-type semiconductor device according to the inventive concept. In the example of the inventive concept, detailed descriptions of aspects and features that are similar to those of the above-described example will be omitted.

Referring to FIG. 1b, the stack-type semiconductor device 100B according to the inventive concept may include a lower junction insulating layer 15 on the lower interlayer insulating layer 13 of the lower device 10 and an upper junction insulating layer 25 under the upper interlayer insulating layer 23 of the upper device 20.

The lower junction insulating layer 15 and the upper junction insulating layer 25 may each be of a layer of insulation material (having a molecular structure) denser than the lower interlayer insulating layer 13 and the upper interlayer insulating layer 23. For example, the lower junction insulating layer 15 and the upper junction insulating layer 25 may include silicon oxycarbonitride (SiOCN), silicon boronitride (SiBN), silicon carbonitride (SiCN), or silicon carbide (SiC).

An upper side surface of the first portion 17a of the lower pad 17 and a side surface of the second portion 17b of the lower pad 17 may be covered by the lower junction insulating layer 15. Also, a lower side surface of the first portion 27a of the upper pad 27 and a side surface of the second portion 27b of the upper pad 27 may be covered by the upper junction insulating layer 25.

Figure 2A:
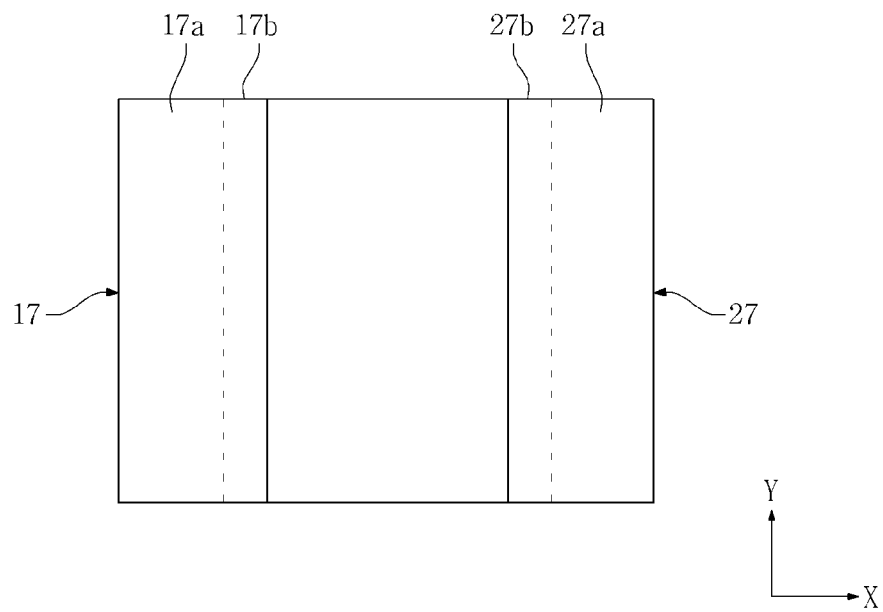
FIGS. 2a, 2b and 2c are top views illustrating bonding shapes of lower pads and upper pads of stack-type semiconductor devices according to various examples of the inventive concept.
Figure 2B:
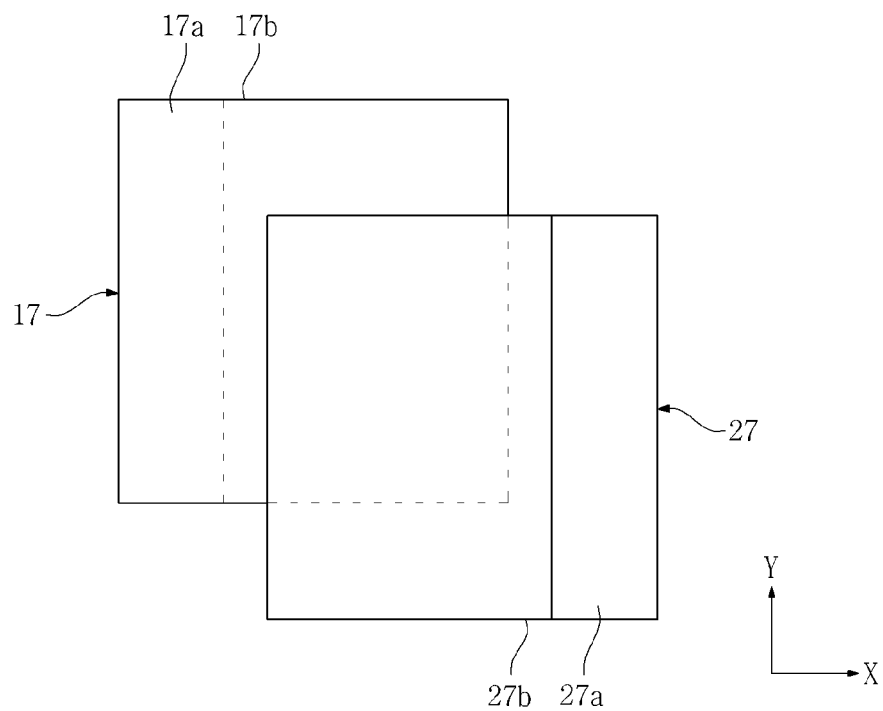
Figure 2C:
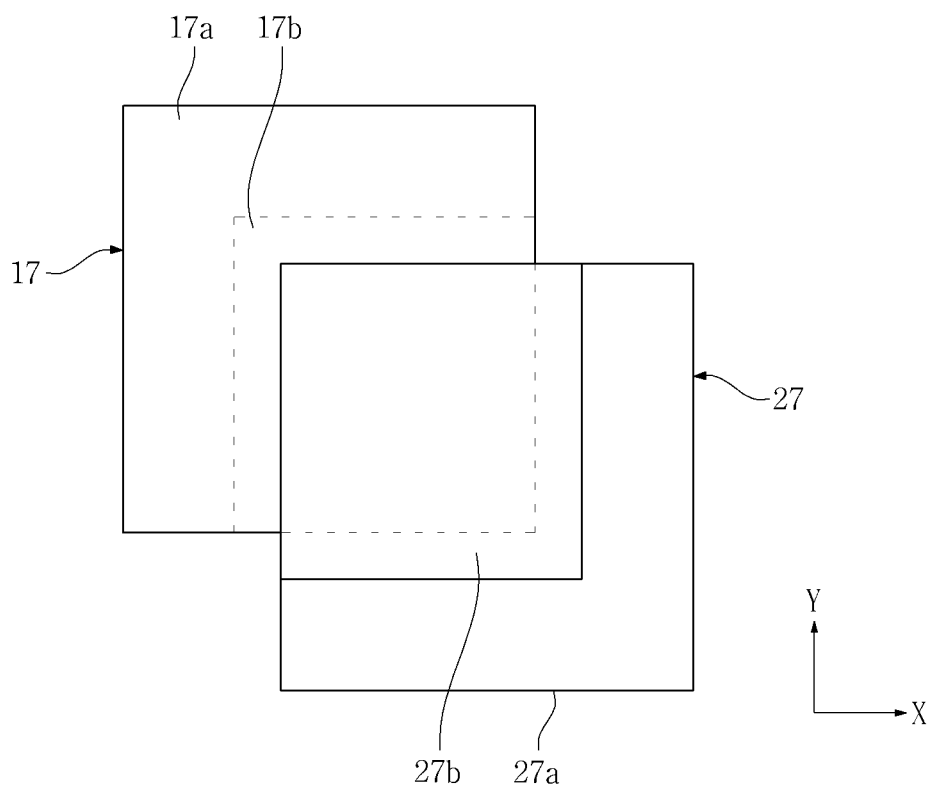

FIGS. 2a through 2c are top views illustrating bonding shapes of lower pads and upper pads of stack-type semiconductor devices according to various examples of the inventive concept.

Referring to FIG. 2a, the lower pad 17 and the upper pad 27 may be misaligned in an X direction in a top view.

The first portion 17a of the lower pad 17 and a portion of the second portion 17b of the lower pad 17 respectively adjacent to the first portion 17a of the lower pad 17 may not overlap the upper pad 27. Also, the first portion 27a of the upper pad 27 and a portion of the second portion 27b of the upper pad 27 respectively adjacent to the first portion 27a of the upper pad 27 may not overlap the lower pad 17.

The first portion 17a of the lower pad 17 and the first portion 27a of the upper pad 27 may have bar shapes extending in, i.e., may be elongated in, a Y direction perpendicular to the X direction.

Referring to FIG. 2b, the lower pad 17 and the upper pad 27 may be misaligned in X and Y directions in a top view. In other words, the lower pad 17 and the upper pad 27 may be offset in a diagonal direction in a top view.

Referring to FIG. 2c, the first portion 17a of the lower pad 17 and the first portion 27a of the upper pad 27 may have bar shapes that are bent at a right angle and extend in X and Y directions perpendicular to each other in a top view.

Figure 3:
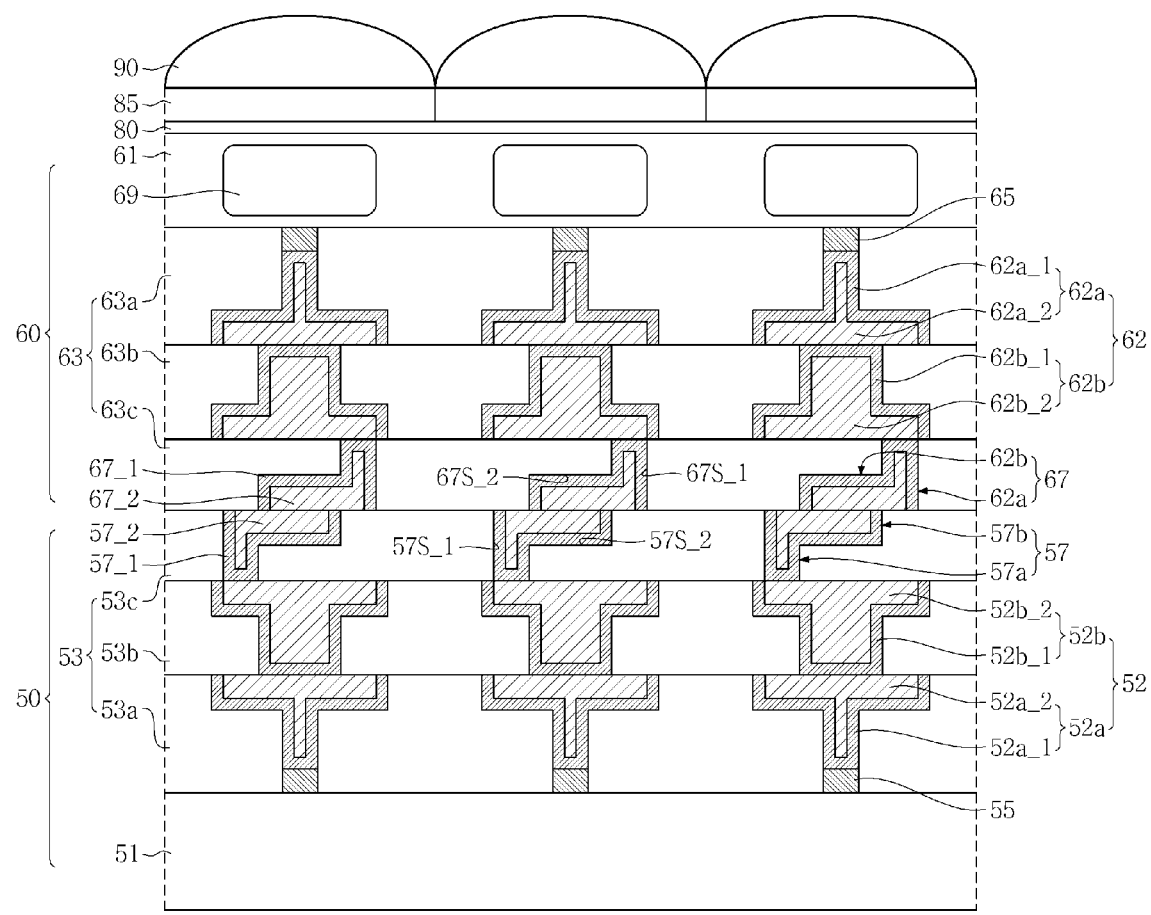
FIG. 3 is a longitudinal cross-sectional view illustrating a stack-type backside illuminated image sensor according to an example of the inventive concept.

FIG. 3 is a longitudinal cross-sectional view of a stack-type backside illuminated image sensor as an example of a stack-type semiconductor device according to the inventive concept. Detailed descriptions of aspects, features, etc. of this example that are similar to those of the above-described examples will be omitted.

Referring to FIG. 3, the stack-type semiconductor device 200 according to the example of the inventive concept may include a lower device 50, an upper device 60 stacked on and bonded to the lower device 50, a passivation layer 80 on the upper device 60, color filters 85, and micro-lenses 90.

The lower device 50 may include a lower substrate 51, lower gate electrodes 55 and lower interconnections 52 on the lower substrate 51, lower pads 57 on the lower interconnections 52, a lower interlayer insulating layer 53 covering side surfaces of the lower gate electrodes 55, the lower interconnections 52, and the lower pads 57.

The lower gate electrodes 55 may include a conductor formed of poly-Si, a metal silicide, or a metal. Although not shown in FIG. 3, the lower device 50 may further include an isolation region formed in the lower substrate 51 between the lower gate electrodes 55, and source/drain areas formed in the lower substrate 51 at both sides of the lower gate electrodes 55.

The lower interconnections 52 may include first lower interconnections 52a on the lower gate electrodes 55 and second lower interconnections 52b on the first lower interconnections 52a. The first lower interconnections 52a and the second lower interconnections 52b may be mixed types of interconnections constituted by via interconnections and planar interconnections vertically overlapping the via interconnections.

The first lower interconnections 52a may include first lower interconnection barrier patterns 52a_1 and first lower interconnection metal patterns 52a_2. The second lower interconnections 52b may include second lower interconnection barrier patterns 52b_1 and second lower interconnection metal patterns 52b_2.

The lower pads 57 may occupy lower pad spaces 57S, and may include lower pad barrier patterns 57_1 and lower pad metal patterns 57_2 formed in the lower pad spaces 57S. The lower pads 57 may include first portions 57a having relatively great thicknesses and second portions 57b having relatively small thicknesses.

The lower pad spaces 57S may include first lower pad spaces 57S_1 partially passing through the lower interlayer insulating layer 53 and exposing a part of upper surfaces of the second lower interconnections 52b, and second lower pad spaces 57S_2 connected to one side of the first lower pad spaces 57S_1 and having depths less than depths of the first lower pad spaces 57S_1.

The first portions 57a of the lower pads 57 may fill the first lower pad spaces 57S_1, and the second portions 57b of the lower pads 57 may fill the second lower pad spaces 57S_2.

The second portions 57b of the lower pads 57 may have first sides that vertically overlap upper pads 67 of the upper device 60 (see FIG. 3), and second sides that are opposite to the first sides and not vertically overlap the upper pads 67. The first portions 57a of the lower pads 57 may be integral with the second sides of the second portions 57b of the lower pads 57, e.g., may be unitary with the second sides of the second portions 57b of the lower pads 57.

The lower pad barrier patterns 57_1 may be conformally formed on bottom surfaces and inner sidewall surfaces defining the lower pad spaces 57S. The lower pad barrier patterns 57_1 may include titanium (Ti), titanium nitride (TiN), tantalum (Ta), tantalum nitride (TaN), titanium tungsten (TiW), or any other suitable barrier metal.

The lower pad metal patterns 57_2 may be disposed on the lower pad barrier patterns 57_1 to fill the lower pad spaces 57S. The lower pad metal patterns 57_2 may include a metal such as copper (Cu), tungsten (W), aluminum (Al), cobalt (Co), or nickel (Ni).

The lower interlayer insulating layer 53 may include a first lower interlayer insulating layer 53a covering side surfaces of the lower gate electrodes 55 and the first lower interconnections 52a, a second lower interlayer insulating layer 53b covering side surfaces of the second lower interconnections 52b, and a third lower interlayer insulating layer 53c covering side surfaces of the lower pads 57.

The upper device 60 may include an upper substrate 61, transmission gate electrodes 65 and upper interconnections 62 disposed under the upper substrate 61, upper pads 67 under the upper interconnections 62, and an upper interlayer insulating layer 63 covering side surfaces of the transmission gate electrodes 65, the upper interconnections 62, and the upper pads 67.

Photodiodes 69 may be disposed in the upper substrate 61. In some examples, pixel isolation trenches may be interposed between the photodiodes 69 in the upper substrate 61.

The transmission gate electrodes 65 may include a conductor formed of poly-Si, a metal silicide, or a metal. The transmission gate electrodes 65 may be disposed adjacent to the photodiodes 69.

The upper interconnections 62 may include first upper interconnections 62a on the transmission gate electrodes 65 and second upper interconnections 62b on the first upper interconnections 62a. The first upper interconnections 62a and the second upper interconnections 62b may be mixed types of interconnections constituted by via interconnections and planar interconnections overlapping the via interconnections.

The first upper interconnections 62a may include first upper interconnection barrier patterns 62a_1 and first upper interconnection metal patterns 62a_2. The second upper interconnections 62b may include second upper interconnection barrier patterns 62b_1 and second upper interconnection metal patterns 62b_2.

The upper pads 67 may occupy upper pad spaces 67S, and may include upper pad barrier patterns 67_1 and upper pad metal patterns 67_2 formed in the upper pad spaces 67S. The upper pads 67 may include first portions 67a having relatively great thicknesses and second portions 67b having relatively small thicknesses.

The upper pad spaces 67S may include first upper pad spaces 67S_1 partially passing through the upper interlayer insulating layer 63 and exposing a part of lower surfaces of the second upper interconnections 62b, and second upper pad spaces 67S_2 connected to one side of the first upper pad spaces 67S_1 and having depths less than depths of the first upper pad spaces 67S_1.

The first portions 67a of the upper pads 67 may fill the first upper pad spaces 67S_1, and the second portions 67b of the upper pads 67 may fill the second upper pad spaces 67S_2.

The second portions 67b of the upper pads 67 may have first sides that vertically overlap lower pads 57, and second sides that are opposite to the first sides and do not vertically overlap the lower pads 57. The first portions 67a of the upper pads 67 may be integral with the second sides of the second portions 67b of the upper pads 67, e.g., may be unitary with the second sides of the second portions 67b of the upper pads 67.

The upper pad barrier patterns 67_1 may be conformally formed on bottom surfaces and inner sidewall surfaces defining the upper pad spaces 67S. The upper pad barrier patterns 67_1 may include titanium (Ti), titanium nitride (TiN), tantalum (Ta), tantalum nitride (TaN), titanium tungsten (TiW), or any other suitable barrier metal.

The upper pad metal patterns 67_2 may be formed on the upper pad barrier patterns 67_1 to fill the upper pad spaces 67S. The upper pad metal patterns 67_2 may include a metal such as copper (Cu), tungsten (W), aluminum (Al), cobalt (Co), or nickel (Ni).

The upper interlayer insulating layer 63 may include a first upper interlayer insulating layer 63a covering side surfaces of the transmission gate electrodes 65 and the first upper interconnections 62a, a second upper interlayer insulating layer 63b covering side surfaces of the second upper interconnections 62b, and a third upper interlayer insulating layer 63c covering side surfaces of the upper pads 67.

The lower pads 57 and the upper pads 67 may be laterally offset or misaligned. For example, the first sides of the second portions 57b of the lower pads 57 may vertically overlap the upper pads 67, and the first sides of the second portions 67b of the upper pad 67 may vertically overlap the lower pads 57. Also, the second sides of the second portions 57b of the lower pads 57 and the first portions 57a of the lower pads 57 may not vertically overlap the upper pads 67, and the second sides of the second portions 67b of the upper pads 67 and the first portions 67a of the upper pads 67 may not vertically overlap the lower pads 57.

Accordingly, the first portions 57a of the lower pads 57 may vertically overlap the third upper interlayer insulating layer 63c of the upper device 60, and the first portions 67a of the upper pads 67 may vertically overlap the third lower interlayer insulating layer 53c of the lower device 50. The first portions 57a of the lower pads 57 may be disposed in a diagonal direction with respect to the first portions 67a of the upper pads 67.

The passivation layer 80 may be conformally formed on an upper surface of the upper substrate 61 of the upper device 60. The passivation layer 80 may be a layer of silicon nitride (SiN).

The color filters 85 and the micro-lenses 90 may be disposed on the passivation layer 80 as vertically aligned with the photodiodes 69, respectively.

FIGS. 4a to 4e illustrate an example of a method of fabricating a stack-type semiconductor device according to the inventive concept.

Figure 4A:
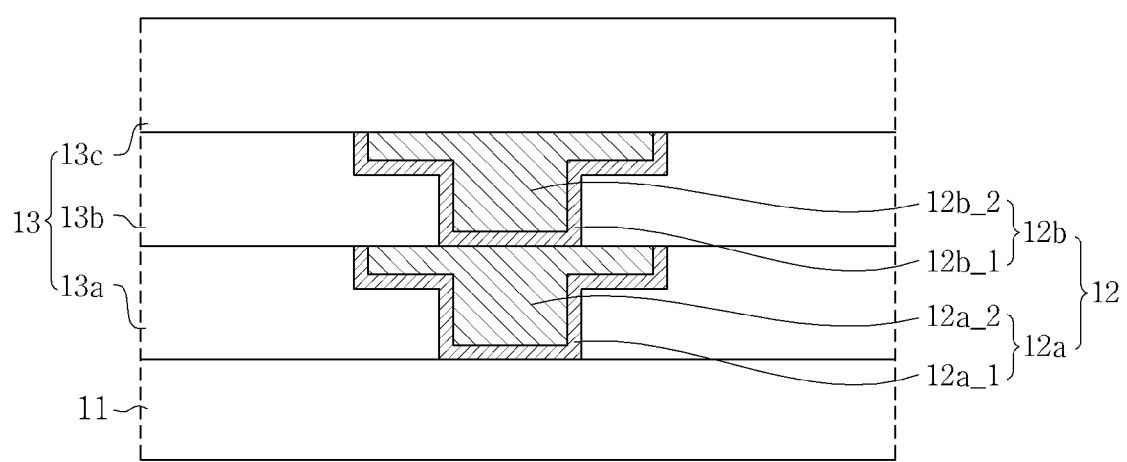
FIGS. 4a, 4b, 4c, 4d and 4e are cross-sectional views of a stack-type semiconductor device during the course of its manufacture and together illustrate an example of a method of fabricating a semiconductor device according to the inventive concept.

Referring to FIG. 4a, the example of the method of fabricating the stack-type semiconductor device according to the inventive concept may include providing a lower substrate 11, and forming a lower interconnection 12 and a lower interlayer insulating layer 13 on the lower substrate 11.

The lower substrate 11 may be constituted by a bulk single crystalline silicon wafer, an SOI wafer, a compound semiconductor wafer, or a wafer on which a silicon epitaxial layer has been grown.

The forming of the lower interconnection 12 and the lower interlayer insulating layer 13 may include forming a first lower interconnection 12a and a first lower interlayer insulating layer 13a that covers side surfaces of the first lower interconnection 12a on the lower substrate 11, forming a second lower interconnection 12b and a second lower interlayer insulating layer 13b that covers side surfaces of the second lower interconnection 12b on the first lower interconnection 12a and the first lower interlayer insulating layer 13a, and forming a third lower interlayer insulating layer 13c on the second lower interconnection 12b and the second lower interlayer insulating layer 13b to cover upper surfaces of the second lower interconnection 12b and the second lower interlayer insulating layer 13b.

In some examples, the first lower interconnection 12a and the second lower interconnection 12b may be formed using a dual damascene process. Accordingly, the first lower interconnection 12a and the second lower interconnection 12b may each be a mixed type of interconnection including a via interconnection and a planar interconnection overlapping the via interconnection and wider in a horizontal direction than the via interconnection.

The first lower interconnection 12a may include a first lower interconnection barrier pattern 12a_1 and a first lower interconnection metal pattern 12a_2 on the first lower interconnection barrier pattern 12a_1. The second lower interconnection 12b may include a second lower interconnection barrier pattern 12b_1 and a second lower interconnection metal pattern 12b_2 on the second lower interconnection barrier pattern 12b_1.

The first lower interconnection barrier pattern 12a_1 and the second lower interconnection barrier pattern 12b_1 may include titanium (Ti), titanium nitride (TiN), tantalum (Ta), tantalum nitride (TaN), titanium tungsten (TiW), or any other suitable barrier metal. The first lower interconnection metal pattern 12a_2 and the second lower interconnection metal pattern 12b_2 may include a metal such as copper (Cu), tungsten (W), aluminum (Al), cobalt (Co), or nickel (Ni). The first lower interlayer insulating layer 13a, the second lower interlayer insulating layer 13b, and the third lower interlayer insulating layer 13c may include silicon oxide.

Figure 4B:
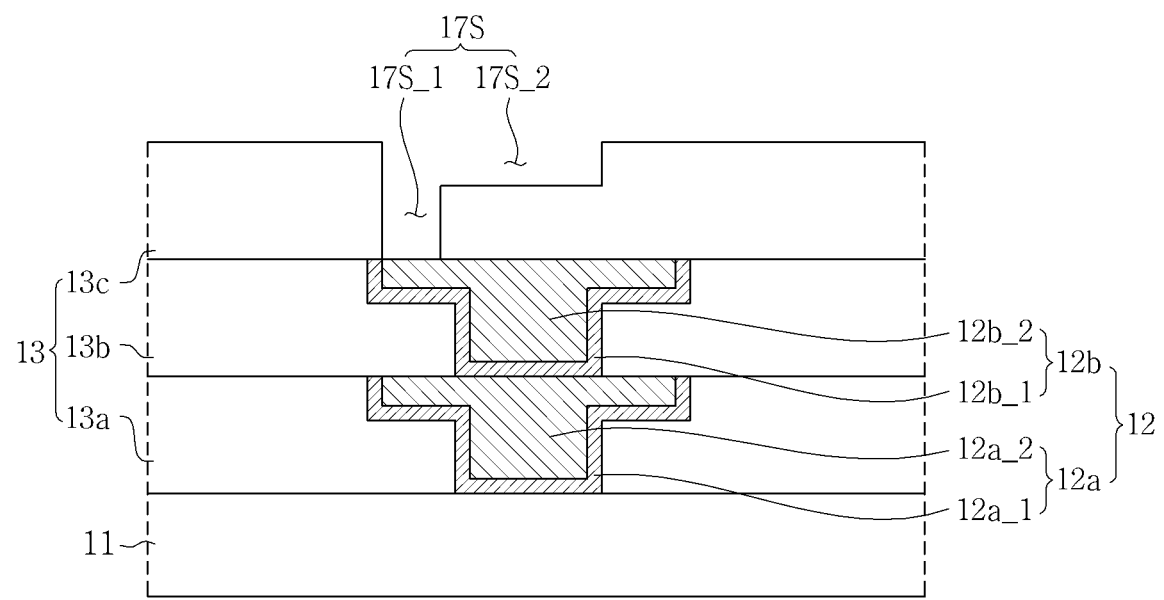

Referring to FIG. 4b, the method may include forming a lower pad space 17S in the lower interlayer insulating layer 13 by performing an etching process.

The forming of the lower pad space 17S may include forming a first lower pad space 17S_1 that passes through the third lower interlayer insulating layer 13c and exposes a portion of the upper surface of the second lower interconnection 12b, and forming a second lower pad space 17S_2 that is connected to one side of the first lower pad space 17S_1 and is shallower in a vertical direction than the first lower pad space 17S_1. In some examples, after forming the first lower pad space 17S_1, the second lower pad space 17S_2 is formed, or after forming the second lower pad space 17S_2, the first lower pad space 17S_1 is formed.

The first lower pad space 17S_1 may be narrower in a horizontal direction than the second lower pad space 17S_2. The bottom of the second lower pad space 17S_2 may be located at a higher level than the bottom of the first lower pad space 17S_1.

Figure 4C:
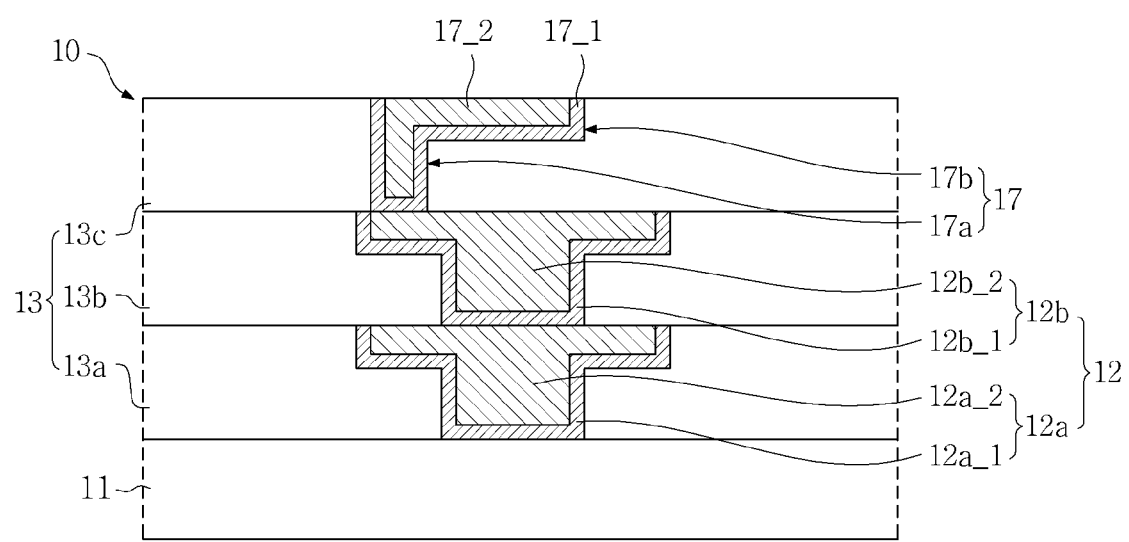

Referring to FIG. 4c, the method may include forming a lower pad 17 in the lower pad space 17S (shown in FIG. 4b).

The forming of the lower pad 17 may include conformally forming a lower pad barrier layer on bottom and inner sidewall surfaces defining the bottom and sides of the lower pad space 17S (again, refer to FIG. 4b) and on an upper surface of the third lower interlayer insulating layer 13c by performing a deposition process, forming a lower pad metal layer on the lower pad barrier layer to fill what remains of the lower pad space 17S by performing a deposition process, and removing the lower pad barrier layer and the lower pad metal layer on the third lower interlayer insulating layer 13c by performing a planarization process such as a CMP process.

The lower pad barrier layer may include titanium (Ti), titanium nitride (TiN), tantalum (Ta), tantalum nitride (TaN), titanium tungsten (TiW), or any other suitable barrier metal. Also, the lower pad metal layer may include a metal such as copper (Cu), tungsten (W), aluminum (Al), cobalt (Co), or nickel (Ni).

The lower pad 17 may include a first portion 17a in the first lower pad space 17S_1 (see FIG. 4b) and a second portion 17b in the second lower pad space 17S_2 (see FIG. 4b). The first portion 17a of the lower pad 17 may be narrower in a horizontal direction than the second portion 17b of the lower pad 17. The second portion 17b of the lower pad 17 may be thinner in a vertical direction than the first portion 17a of the lower pad 17.

Figure 4D:
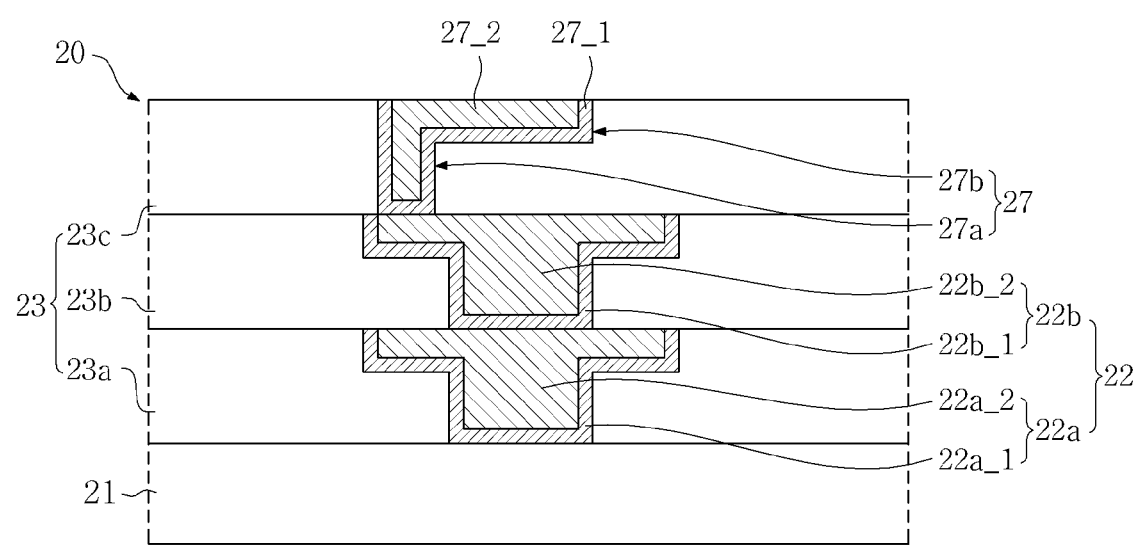

Referring to FIG. 4d, the method may include forming an upper device 60.

The forming of the upper device 60 may include providing an upper substrate 21, forming an upper interconnection 22 and an upper interlayer insulating layer 23 on the upper substrate 21, forming an upper pad space 27S (see FIG. 1a) in the upper interlayer insulating layer 23 by performing an etching process, and forming an upper pad 27 in the upper pad space 27S.

The upper substrate 21 may be constituted by a bulk single crystalline silicon wafer, an SOI wafer, a compound semiconductor wafer, or a wafer on which a silicon epitaxial layer is grown.

The forming of the upper interconnection 22 and the upper interlayer insulating layer 23 may include forming a first upper interconnection 22a and a first upper interlayer insulating layer 23a that covers side surfaces of the first upper interconnection 22a on the upper substrate 21, forming a second upper interconnection 22b and a second upper interlayer insulating layer 23b that covers side surfaces of the second upper interconnection 22b on the first upper interconnection 22a and the first upper interlayer insulating layer 23a, and forming a third upper interlayer insulating layer 23c on the second upper interconnection 22b and the second upper interlayer insulating layer 23b to cover upper surfaces of the second upper interconnection 22b and the second upper interlayer insulating layer 23b.

In some examples, the first upper interconnection 22a and the second upper interconnection 22b may be formed using a dual damascene process. Accordingly, the first upper interconnection 22a and the second upper interconnection 22b may each be a mixed type of interconnection constituted by a via interconnection and a planar interconnection overlapping the via interconnection and wider in a horizontal direction than the via interconnection.

The first upper interconnection 22a may include a first upper interconnection barrier pattern 22a_1 and a first upper interconnection metal pattern 22a_2 on the first upper interconnection barrier pattern 22a_1. The second upper interconnection 22b may include a second upper interconnection barrier pattern 22b_1 and a second upper interconnection metal pattern 22b_2 on the second upper interconnection barrier pattern 22b_1.

The first upper interconnection barrier pattern 22a_1 and the second upper interconnection barrier pattern 22b_1 may include titanium (Ti), titanium nitride (TiN), tantalum (Ta), tantalum nitride (TaN), titanium tungsten (TiW), or any other suitable barrier metal. The first upper interconnection metal pattern 22a_2 and the second upper interconnection metal pattern 22b_2 may include a metal such as copper (Cu), tungsten (W), aluminum (Al), cobalt (Co), or nickel (Ni). The first upper interlayer insulating layer 23a, the second upper interlayer insulating layer 23b, and the third upper interlayer insulating layer 23c may include a layer of silicon oxide.

The forming of the upper pad space may include forming a first upper pad space that passes through the third upper interlayer insulating layer 23c and exposes a portion of the upper surface of the second upper interconnection 22b, and forming a second upper pad space that is connected to one side of the first upper pad space and is shallower in a vertical direction than the first upper pad space 27S_1.

The second upper pad space 27S_2 may be wider in a horizontal direction than the first upper pad space 27S_1. The bottom of the second upper pad space 27S_2 may be located at a higher level than the bottom of the first upper pad space 27S_1.

The forming of the upper pad 27 may include conformally forming an upper pad barrier layer on a bottom surface and inner sidewall surfaces defining the upper pad space 27S and an upper surface of the third upper interlayer insulating layer 23c by performing a deposition process, forming an upper pad metal layer on the upper pad barrier layer to fill what remains of the upper pad space 27S by performing a deposition process, and removing the upper pad barrier layer and the upper pad metal layer on the third upper interlayer insulating layer 23c by performing a planarization process such as a CMP process.

The upper pad barrier layer may include titanium (Ti), titanium nitride (TiN), tantalum (Ta), tantalum nitride (TaN), titanium tungsten (TiW), or any other suitable barrier metal. Also, the upper pad metal layer may include a metal such as copper (Cu), tungsten (W), aluminum (Al), cobalt (Co), or nickel (Ni).

The upper pad 27 may include a first portion 27a in the first upper pad space 27S_1 (see FIG. 1a) and a second portion 27b in the second upper pad space 27S_2 (see FIG. 1a). The second portion 27b of the upper pad 27 may be wider in a horizontal direction than the first portion 27a of the upper pad 27. The second portion 27b of the upper pad 27 may be shallower in a vertical direction than the first portion 27a of the upper pad 27.

Figure 4E:
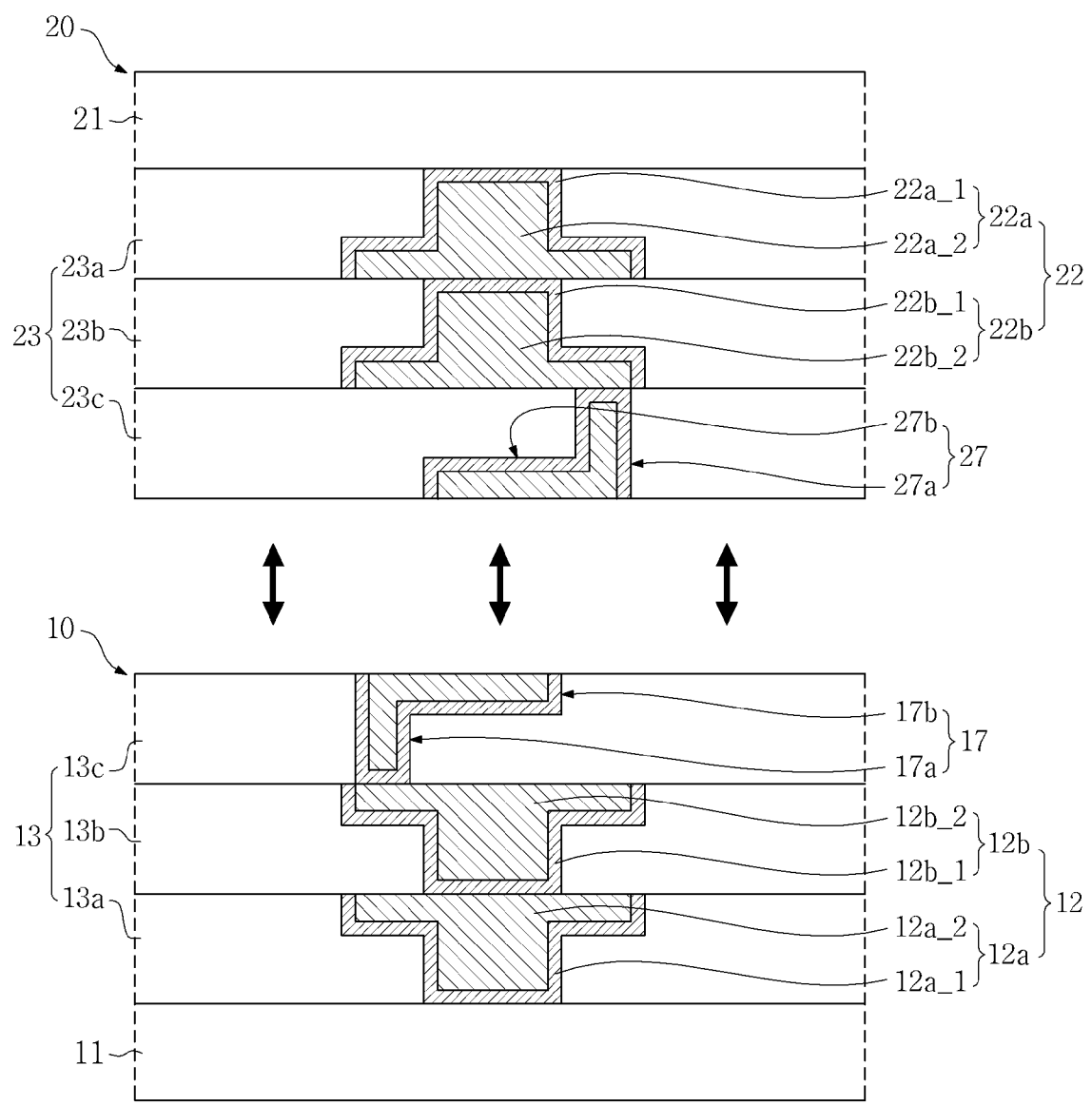

Referring to FIG. 4e, the method may include turning over the upper device 20 and disposing it on the lower device 10. Accordingly, the upper pad 27 of the upper device 20 and the lower pad 17 of the lower device 10 may face each other. At this time, the second portion 27b of the upper pad 27 may vertically overlap the second portion 17b of the lower pad 17, the first portion 27a of the upper pad 27 may be disposed along a diagonal direction with respect to the first portion 17a of the lower pad 17 (i.e., a direction inclined relative to the vertical and passing through geometric centers of the first portions 17a, 27a of the pads or of their vertical sectional profiles), and the first portion 27a of the upper pad 27 and the first portion 17a of the lower pad 17 may vertically overlap the third lower interlayer insulating layer 13c and the third upper interlayer insulating layer 23c, respectively.

Referring again to FIG. 1a, the method may include bonding the lower device 10 and the upper device 20.

FIGS. 5a to 5e illustrate an example of a method of fabricating a stack-type backside illuminated image sensor according to the inventive concept. Detailed descriptions of aspects and features that are similar to those of the above-described examples will be omitted.

Figure 5A:
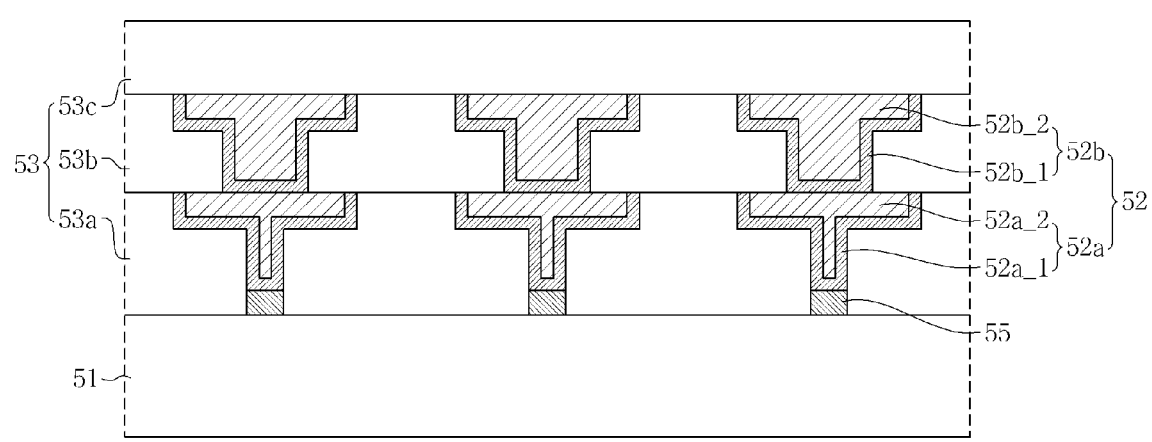
FIGS. 5a, 5b, 5c, 5d and 5e are cross-sectional views of a stack-type backside illuminated image sensor during the course of its manufacture and together illustrate an example of a method of fabricating an image sensor according to the inventive concept.

Referring to FIG. 5a, the method of fabricating the stack-type semiconductor device according to the inventive concept may include providing a lower substrate 51, and forming lower gate electrodes 55, lower interconnections 52, and a lower interlayer insulating layer 53 on the lower substrate 51.

The lower gate electrodes 55 may be formed using a deposition process, a photolithography process, and/or an etching process. The lower gate electrodes 55 may be formed of poly-Si, a metal silicide, or a metal.

The lower interconnections 52 may include first lower interconnections 52a and second lower interconnections 52b formed using a dual damascene process. Accordingly, the first lower interconnections 52a and the second lower interconnections 52b may each be a mixed type of interconnection constituted by a via interconnection and a planar interconnection overlapping the via interconnection and having a width greater than a width of the via interconnection in a horizontal direction.

The first lower interconnections 52a may include first lower interconnection barrier patterns 52a_1 and first lower interconnection metal patterns 52a_2 on the first lower interconnection barrier patterns 52a_1. The second lower interconnection 52b may include second lower interconnection barrier patterns 52b_1 and second lower interconnection metal patterns 52b_2 on the second lower interconnection barrier pattern 52b_1.

The lower interlayer insulating layer 53 may include a first lower interlayer insulating layer 53a covering the lower gate electrodes 55 and side surfaces of the first lower interconnections 52a, a second lower interlayer insulating layer 53b covering the second lower interconnections 52b, and a third lower interlayer insulating layer 53c covering upper surfaces of the second lower interconnection 52b and the second lower interlayer insulating layer 53b.

Figure 5B:
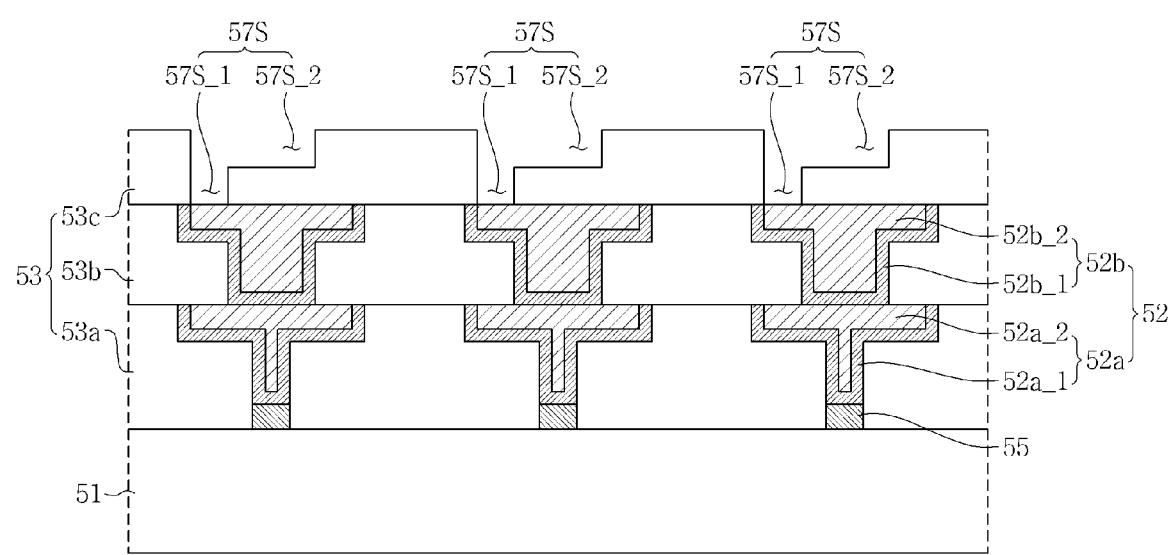

Referring to FIG. 5b, the method may include forming lower pad spaces 57S in the lower interlayer insulating layer 53 by performing an etching process.

The forming of the lower pad spaces 57S may include forming first lower pad spaces 57S_1 that pass through the third lower interlayer insulating layer 53c and expose a part of the upper surfaces of the second lower interconnections 52b, and forming second lower pad spaces 57S_2 that are connected to one side of the first lower pad spaces 57S_1 and have depths less than depths of the first lower pad spaces 57S_1.

Figure 5C:
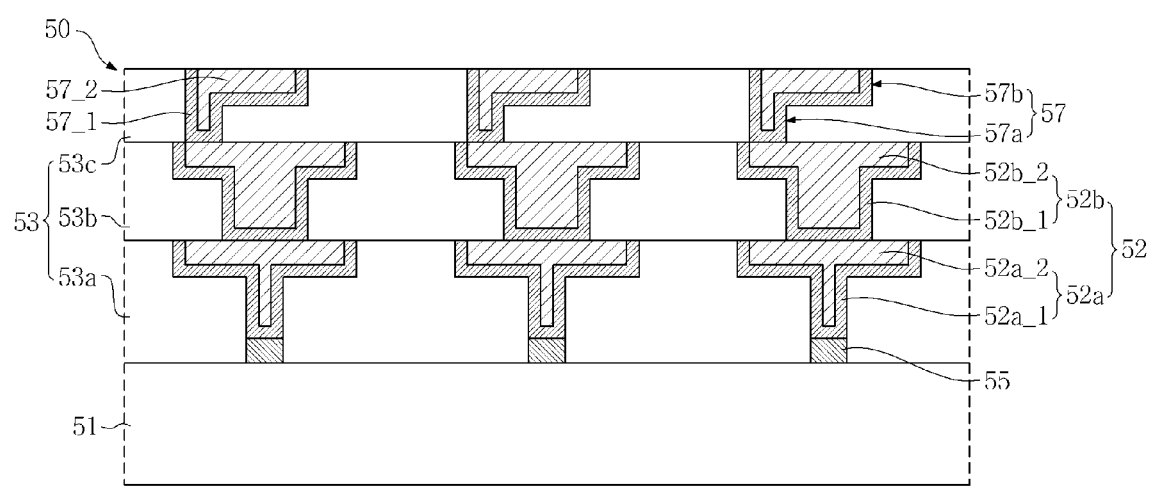

Referring to FIG. 5c, the method may include forming lower pads 57 in the lower pad spaces 57S (see FIG. 5b).

The forming of the lower pads 57 may include conformally forming a lower pad barrier layer on bottom surfaces and inner sidewall surfaces defining the lower pad spaces 57S (see FIG. 5b) and an upper surface of the third lower interlayer insulating layer 53c by performing a deposition process, forming a lower pad metal layer on the lower pad barrier layer to fill what remains of the lower pad spaces 57S by performing a deposition process, and removing the lower pad barrier layer and the lower pad metal layer on the third lower interlayer insulating layer 53c by performing a planarization process such as a CMP process.

The lower pads 57 may include first portions 57a in the first lower pad spaces 57S_1 and second portions 57b in the second lower pad spaces 57S_2. The first portions 57a of the lower pads 57 may be narrower in a horizontal direction than the second portions 57b of the lower pads 57. The second portions 57b of the lower pads 57 may be thinner in a vertical direction than the first portions 57a of the lower pads 57.

Figure 5D:
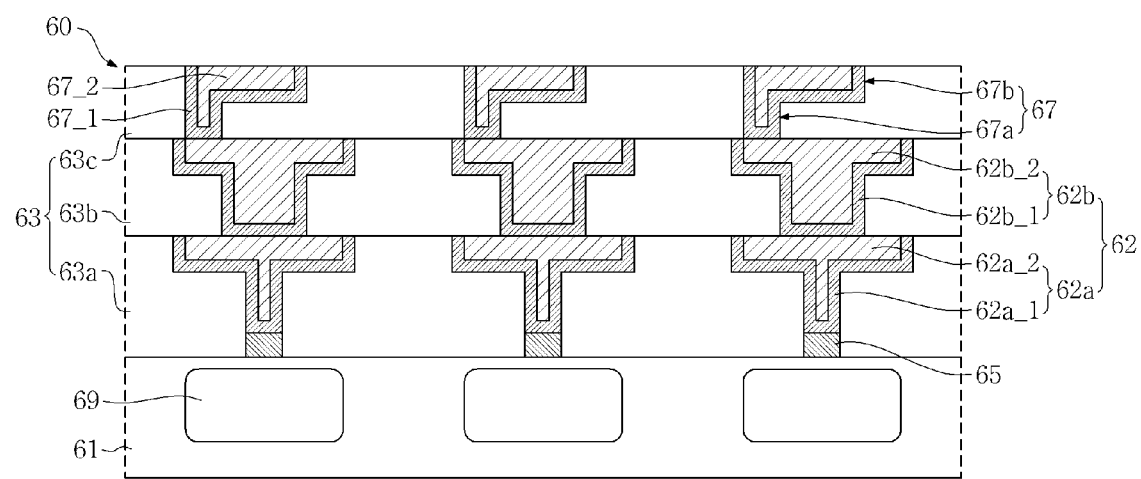

Referring to FIG. 5d, the method may include forming an upper device 60.

The forming of the upper device 60 may include providing an upper substrate 61, forming photodiodes 69 in the upper substrate 61, forming transmission gate electrodes 65, upper interconnections 62, and an upper interlayer insulating layer 63 on an upper surface of the upper substrate 61, forming upper pad spaces 67S in the upper interlayer insulating layer 63, and forming upper pads 67 in the upper pad spaces 67S.

The forming of the photodiodes 69 may be performed using an ion implantation process that implants impurities in the form of ions into the upper substrate 61.

The transmission gate electrodes 65 may be formed using a deposition process, a photolithography process, and/or an etching process. The transmission gate electrodes 65 may be formed of poly-Si, a metal silicide, or a metal.

The upper interconnections 62 may include first upper interconnections 62a and second upper interconnections 62b that are formed using a dual damascene process. The first upper interconnections 62a may include first upper interconnection barrier patterns 62a_1 and first upper interconnection metal patterns 62a_2 on the first upper interconnection barrier patterns 62a_1. The second upper interconnection 62b may include second upper interconnection barrier patterns 62b_1 and second upper interconnection metal patterns 62b_2 on the second upper interconnection barrier pattern 62b_1.

The upper interlayer insulating layer 63 may include a first upper interlayer insulating layer 63a covering the transmission gate electrodes 65 and side surfaces of the first upper interconnections 62a, a second upper interlayer insulating layer 63b covering the second upper interconnections 62b, and a third upper interlayer insulating layer 63c covering upper surfaces of the second upper interconnection 62b and the second upper interlayer insulating layer 63b.

The forming of the upper pad spaces 67S (see FIG. 3) may include forming first upper pad spaces 67S_1 (see FIG. 3) that pass through the third upper interlayer insulating layer 63c and expose a part of the upper surfaces of the second upper interconnections 62b, and forming second upper pad spaces 67S_2 (see FIG. 3) that are connected to one side of the first upper pad spaces 67S_1 and have depths less than depths of the first upper pad spaces 67S_1.

The forming of the upper pads 67 may include conformally forming an upper pad barrier layer on bottom surfaces and inner sidewall surfaces defining the upper pad spaces 67S (see FIG. 3) and an upper surface of the third upper interlayer insulating layer 63c by performing a deposition process, forming an upper pad metal layer on the upper pad barrier layer to fill what remains of the upper pad spaces 67S by performing a deposition process, and removing the upper pad barrier layer and the upper pad metal layer on the third upper interlayer insulating layer 63c by performing a planarization process such as a CMP process.

The upper pads 67 may include first portions 67a in the first upper pad spaces 67S_1 and second portions 67b in the second upper pad spaces 67S_2. The first portions 67a of the upper pads 67 may be narrower than the second portions 67b of the upper pads 67. The second portions 67b of the upper pads 67 may be thinner than the first portions 67a of the upper pads 67.

Figure 5E:
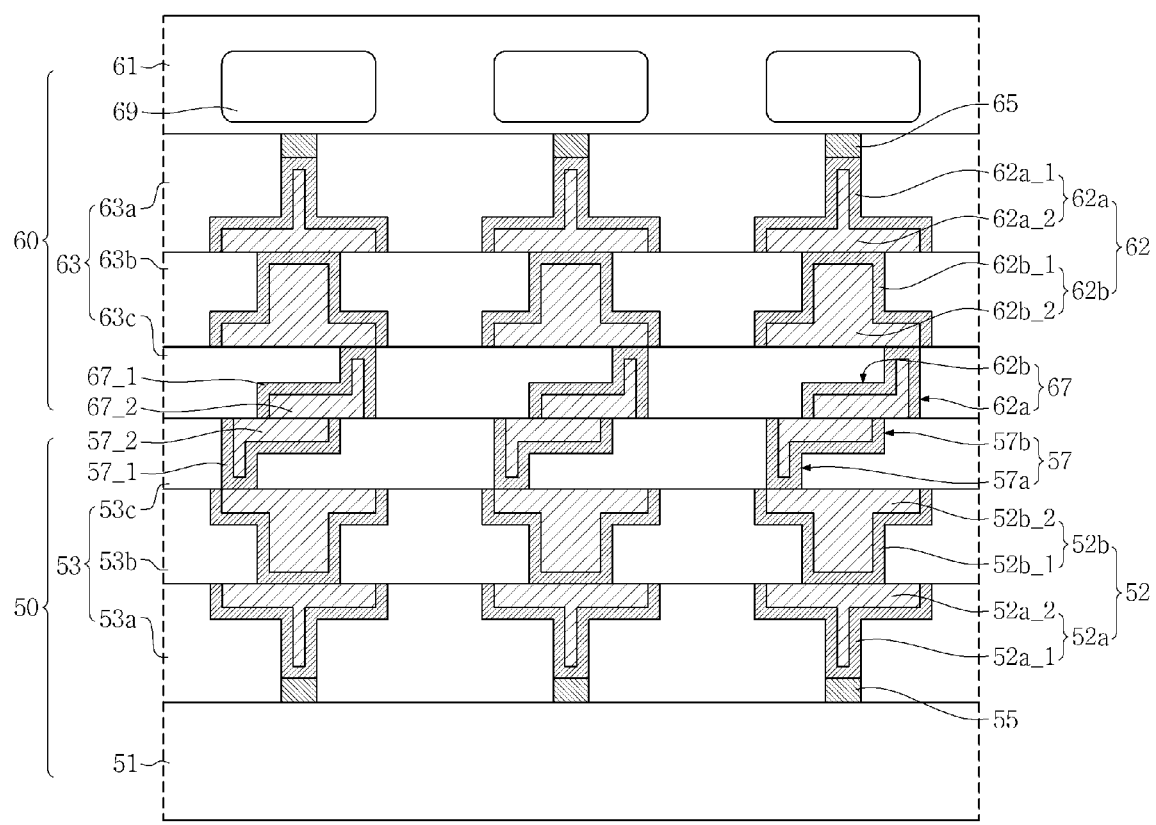

Referring to FIG. 5e, the method may include bonding the lower device 50 and the upper device 60.

The bonding of the lower device 50 and the upper device 60 may include inverting the upper device 60 and setting it on the lower device 50. Accordingly, the upper pads 67 of the upper device 60 and the upper surface of the third upper interlayer insulating layer 63c may be in contact with the lower pads 57 of the lower device 50 and the upper surface of the third lower interlayer insulating layer 53c. For example, the second portions 67b of the upper pads 67 and the second portions 57b of the lower pads 57 may be in contact with each other. Furthermore, the first portions 67a of the upper pads 67 and the first portions 57a of the lower pads 57 may be in contact with the third lower interlayer insulating layer 53c and the third upper interlayer insulating layer 63c, respectively.

Referring again to FIG. 3, the method may include forming a passivation layer 80 on a lower surface of the upper substrate 61, forming color filters 85 on the passivation layer 80, and forming micro-lenses 90 on the color filters 85. In some examples, the method may additionally include partially removing a thickness of the upper substrate 61 at the exposed surface thereof by performing an etching process before forming the passivation layer 80.

In a stack-type semiconductor device in accordance with the inventive concept, a lower pad and an upper pad are formed of stepped structures including thick portions and thin portions and the thin portions of the lower pad and the upper pad are bonded to each other. Therefore, thermal expansion of the bonded portions is kept to a minimum. As a result, bonding failures between interlayer insulating layers that cover side surfaces of the lower pad and the upper pad are reduced.

Other various effects have been described in the above detailed description.

Although examples of the inventive concept have been described above, those skilled in the art will readily appreciate that many modifications are possible without materially departing from the novel teachings and advantages associated with the inventive concept. Accordingly, all such modifications are seen to be within the true spirit and scope of the inventive concept as defined by the appended claims.

What is claimed is:
1. A semiconductor device comprising:
a lower device including a lower substrate, a lower interconnection structure on the lower substrate, a lower pad on the lower interconnection structure, and a lower interlayer insulation covering side surfaces of the lower interconnection structure and of the lower pad; and
an upper device disposed on the lower device and including an upper substrate, an upper interconnection structure under the upper substrate, an upper pad under the upper interconnection structure, and an upper interlayer insulation covering side surfaces of the upper interconnection structure and of the upper pad, and wherein the lower pad has a first portion and a second portion, the first portion of the lower pad being thicker, in a vertical direction, than the second portion of the lower pad, the upper pad has a first portion and a second portion, the first portion of the upper pad being thicker, in the vertical direction, than the second portion of the upper pad, and the second portion of the lower pad is bonded to the upper pad at the second portion of the upper pad, the first portion of the lower pad is in contact with a lower surface of the upper interlayer insulation, and the first portion of the upper pad is in contact with an upper surface of the lower interlayer insulation.

2. The semiconductor device of claim 1, wherein:
the second portion of the lower pad has a first side vertically overlapping the second portion of the upper pad and a second side vertically overlapping the upper interlayer insulation; and
the second portion of the upper pad includes a first side vertically overlapping the second portion of the lower pad and a second side overlapping the lower interlayer insulation.

3. The semiconductor device of claim 2, wherein:
the first portion of the lower pad is connected to the second side of the second portion of the lower pad; and
the first portion of the upper pad is connected to the second side of the second portion of the upper pad.

4. The semiconductor device of claim 3, wherein the first portion of the lower pad and the first portion of the upper pad are disposed along a diagonal direction that is inclined relative to the vertical.

5. The semiconductor device of claim 1, wherein:
the lower interlayer insulation includes a first lower interlayer insulating layer covering side surfaces of the lower interconnection structure and a second lower interlayer insulating layer covering side surfaces of the lower pad; and
the upper interlayer insulation includes a first upper interlayer insulating layer covering side surfaces of the upper interconnection structure and a second upper interlayer insulating layer covering side surfaces of the upper pad.

6. The semiconductor device of claim 5, wherein:
the second lower interlayer insulating layer spans an upper surface of the lower interconnection structure and a lower surface of the second portion of the lower pad; and
the second upper interlayer insulating layer spans a lower surface of the upper interconnection structure and an upper surface of the second portion of the upper pad.

7. The semiconductor device of claim 1, wherein the upper pad is laterally offset in a first direction from the lower pad.

8. The semiconductor device of claim 7, wherein the first portion of the lower pad and the first portion of the upper pad have forms, as viewed in plan, that are elongated in a second direction perpendicular to the first direction.

9. The semiconductor device of claim 1, wherein the upper pad is laterally offset in a first direction and a second direction perpendicular to the first direction with respect to the lower pad.

10. The semiconductor device of claim 9, wherein each of the first portion of the lower pad and the first portion of the upper pad have sections that intersect at a right angle and are elongated in the first direction and the second direction, respectively.

11. The semiconductor device of claim 1, further comprising:
a photodiode inside the upper substrate;
a passivation layer disposed on the upper substrate;
a color filter disposed on the passivation layer and vertically aligned with the photodiode; and
a micro-lens disposed on the color filter.

12. The semiconductor device of claim 11, further comprising:
a transmission gate electrode adjacent to the photodiode on the upper substrate; and
a lower gate electrode disposed on the lower substrate.

13. A semiconductor device comprising:
a lower substrate;
a lower interconnection structure disposed on the lower substrate;
a lower pad disposed on the lower interconnection structure, wherein the lower pad has a first portion that is in contact with the lower interconnection structure, and a second portion that is connected to an upper portion of one side of the first portion of the lower pad, the second portion of the lower pad being thinner than the first portion of the lower pad in a vertical direction;
an upper pad disposed on the lower pad, wherein the upper pad has a first portion, and a second portion that is connected to a lower portion of one side of the first portion of the upper pad and is bonded to the second portion of the lower pad, the second portion of the upper pad being thinner than the first portion of the upper pad in the vertical direction;
an upper interconnection structure disposed on the upper pad and in contact with the first portion of the upper pad; and
an upper substrate disposed on the upper interconnection structure,
wherein the first portion of the lower pad and the first portion of the upper pad are disposed along a diagonal direction that is inclined relative to the vertical direction.

14. The semiconductor device of claim 13, further comprising:
a first lower interlayer insulating layer disposed on the lower substrate and covering side surfaces of the lower interconnection;
a second lower interlayer insulating layer disposed on the first lower interlayer insulating layer and covering lower side surfaces of the first portion of the lower pad;
a lower junction insulating layer disposed on the second lower interlayer insulating layer and covering upper side surfaces of the first portion of the lower pad and side surfaces of the second portion of the lower pad;
a first upper interlayer insulating layer disposed under the upper substrate and covering side surfaces of the upper interconnection;
a second upper interlayer insulating layer disposed under the first upper interlayer insulating layer and covering upper side surfaces of the first portion of the upper pad; and
an upper junction insulating layer disposed under the second upper interlayer insulating layer and covering side surfaces of the first portion of the upper pad and side surfaces of the second portion of the upper pad.

15. The semiconductor device of claim 14, wherein:
the lower junction insulating layer has a molecular structure denser than molecular structures of the first lower interlayer insulating layer and the second lower interlayer insulating layer; and the upper junction insulating layer has a molecular structure denser than molecular structures of the first upper interlayer insulating layer and the second upper interlayer insulating layer.

16. A semiconductor device comprising:
a lower semiconductor substrate;
a lower interlayer insulation disposed on the lower semiconductor substrate and having an upper surface;
an upper interlayer insulation disposed on the lower interlayer insulation and having a lower surface constituting an interface with the upper surface of the lower interlayer insulation;
an upper semiconductor substrate disposed on the upper interlayer insulation; and
an interlayer contact structure embedded in the upper and lower interlayer insulation, the interlayer contact structure including:
a lower land of conductive material disposed in an upper portion of the lower interlayer insulation,
a lower via integral with the lower land at an outer peripheral portion of the lower land and extending vertically within the lower interlayer insulation,
an upper land of conductive material disposed in a lower portion of the upper interlayer insulation, and
an upper via integral with the upper land at an outer peripheral portion of the upper land and extending vertically within the upper interlayer insulation, and
wherein at least parts of the upper and lower lands are disposed directly across from one another on opposite sides of a plane coincident with the interface between the lower interlayer insulation and upper interlayer insulation,
the upper and lower vias are laterally offset entirely from each other,
the lower via extends further into the lower interlayer insulation than the lower land relative to said plane coincident with the interface between the lower interlayer insulation and upper interlayer insulation, and
the upper via extends further into the upper interlayer insulation than the upper land relative to said plane coincident with the interface between the lower interlayer insulation and upper interlayer insulation.

17. The semiconductor device of claim 16, further comprising lower conductive interconnection structure embedded within the lower interlayer insulation as interposed between the interlayer contact structure and the lower substrate, and electrically connected to the interlayer contact structure at the lower via thereof; and
upper conductive interconnection structure embedded within the upper interlayer insulation as interposed between the interlayer contact structure and the upper substrate, and electrically connected to the interlayer contact structure at the upper via thereof.

18. The semiconductor device of claim 16, wherein the lower interlayer insulation includes a first layer of insulation in which the lower land of conductive material is disposed and a second layer of insulation into which the lower via extends from the lower land,
the upper interlayer insulation includes a third layer of insulation in which the upper land of conductive material is disposed and a fourth layer of insulation into which the upper via extends from the upper land,
the first and third layers of insulation are of the same material,
the second and fourth layers of insulation are of the same material,
the material of the second and fourth layers of insulation is denser than the material of the first and third layers of insulation.

19. The semiconductor device of claim 16, wherein the lower via and the lower land of conductive material together constitute a lower pad structure,
the upper via and the upper land of conductive material together constitute an upper pad structure,
the upper pad structure has the same size and shape as the lower pad structure but is inverted and laterally offset relative to the lower pad structure.

20. The semiconductor device of claim 16, wherein each of the upper and lower vias has a horizontal cross section in the shape of a rectangle, and the upper and lower pad structures are laterally offset from each other in a direction that is oblique with respect to sides of the rectangle.

\* \* \* \* \*

UNITED STATES PATENT AND TRADEMARK OFFICE
CERTIFICATE OF CORRECTION

PATENT NO. : 9,859,321 B2  
APPLICATION NO. : 15/333382  
DATED : January 2, 2018  
INVENTOR(S) : Donghyun Kim and Doowon Kwon Page 1 of 1

It is certified that error appears in the above-identified patent and that said Letters Patent is hereby corrected as shown below:

In the Drawings

In FIG. 3 (sheet 5), the reference numbers appearing to the left of bracket 67 are changed from "62a" and "62b" to -- 67a -- and -- 67b --, respectively.

In FIG. 5e (sheet 15), the reference numbers appearing to the left of bracket 67 are changed from "62a" and "62b" to -- 67a -- and -- 67b --, respectively.

Signed and Sealed this  
Thirteenth Day of October, 2020

Andrei Iancu  
*Director of the United States Patent and Trademark Office*